(12) United States Patent
Berezin

(10) Patent No.: US 6,870,149 B2
(45) Date of Patent: Mar. 22, 2005

(54) SUPERPOSED MULTI-JUNCTION COLOR APS

(75) Inventor: Vladimir Berezin, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 24 days.

(21) Appl. No.: 10/254,140

(22) Filed: Sep. 24, 2002

(65) Prior Publication Data

US 2003/0020003 A1 Jan. 30, 2003

Related U.S. Application Data

(63) Continuation of application No. 09/522,286, filed on Mar. 9, 2000, now Pat. No. 6,455,833.
(60) Provisional application No. 60/124,084, filed on Mar. 9, 1999.

(51) Int. Cl.[7] .............................. H01L 27/00; G01J 3/50
(52) U.S. Cl. .................... 250/208.1; 250/226; 257/440
(58) Field of Search ............................ 250/208.1, 226, 250/214.1; 257/431, 440, 443, 461; 348/272, 274, 276, 277, 308

(56) References Cited

U.S. PATENT DOCUMENTS

| | | | |
|---|---|---|---|
| 3,860,956 A | | 1/1975 | Kubo et al. |
| 5,614,744 A | | 3/1997 | Merrill |
| 5,757,840 A | | 5/1998 | Hiroki |
| 5,945,722 A | | 8/1999 | Tsuei et al. |
| 5,965,875 A | * | 10/1999 | Merrill ..................... 250/208.1 |
| 6,028,612 A | * | 2/2000 | Balakrishnan et al. ...... 345/517 |
| 6,066,510 A | | 5/2000 | Merrill |
| 6,111,247 A | * | 8/2000 | Sengupta .................... 250/226 |
| 6,150,683 A | | 11/2000 | Merrill et al. |
| 6,166,768 A | * | 12/2000 | Fossum et al. ............. 348/308 |
| 6,300,612 B1 | * | 10/2001 | Yu .......................... 250/208.1 |
| 6,330,113 B1 | | 12/2001 | Slagle et al. |
| 6,455,833 B1 | * | 9/2002 | Berezin ................... 250/208.1 |
| 6,606,120 B1 | | 8/2003 | Merrill et al. |
| 6,632,701 B2 | | 10/2003 | Merrill |
| 2002/0058353 A1 | | 5/2002 | Merrill |
| 2002/0171881 A1 | | 11/2002 | Merrill et al. |
| 2003/0038296 A1 | | 2/2003 | Merrill |
| 2003/0169359 A1 | | 9/2003 | Merrill et al. |

* cited by examiner

Primary Examiner—Kevin Pyo
(74) Attorney, Agent, or Firm—Dickstein Shapiro Morin & Oshinsky LLP

(57) ABSTRACT

A CMOS image sensor obtains color through the use of two or three superposed layers. Each pixel in the image sensor includes a plurality of superposed photosensitive p-n junctions with individual charge integration regions. The combination of each of the superposed layers provides increased sensitivity and resolution of a single chip color imager.

17 Claims, 2 Drawing Sheets

SUPERPOSED MULTI-JUNCTION COLOR APS

CROSS REFERENCE TO RELATED APPLICATIONS

This application is a continuation of U.S. application Ser. No. 09/522,286, filed Mar. 9, 2000, now U.S. Pat. No. 6,455,833, which claims the benefit of the U.S. provisional application Ser. No. 60/124,084, filed Mar. 9, 1999.

TECHNICAL FIELD

This invention relates to image sensors, and more particularly to active pixel sensors having superposed regions.

BACKGROUND

CMOS image sensors have a significant advantage of allowing lower power consumption. An active pixel sensor (APS) is one example of a low power consumption image sensor which has photoreceptors, and buffer circuitry, and processing circuitry, all on one substrate.

Many different things can be done using the CMOS technology. For example, many of the applications by Photobit, Inc. of Pasadena, Calif. have enabled various operations to be carried out on the same substrate as the image sensor.

Certain resolutions are desired for different operations. For example, for a still camera, one often wants very high resolution, e.g. similar to the resolution that one could get from a photograph. This could require more than 1½ megapixels. However, people are accustomed to obtaining less resolution in a video environment, which shows a progression of information, e.g., 30 to 60 frames per second.

Another consideration is the way in which one obtains color from a color sensor. Each pixel value includes an indication of values for red, green and blue at the location of that pixel. However, in actuality, the system obtains red values from one pixel area, green from another, and blue from yet another. The three values are neighboring values, so the actually-obtained information is interpolated to obtain postulated magnitudes of colors at other locations.

Another way in which this can be done is by putting small prisms at each pixel. A lot of adjustment can be required.

SUMMARY

The present invention obtains color in a CMOS image sensor with the use of two or three superposed layers. Each pixel in the image sensor includes a plurality of superposed photosensitive p-n junctions with individual charge integration regions. The combination of each of the superposed layers provides increased sensitivity and resolution of a single chip color imager.

One aspect of the invention includes a photosensor comprising a first charge collection region having a first absorption length and a second charge collection region having a second absorption length. The first charge collection region and the second charge collection region are superposed. The photosensor further comprises a third charge collection region having a third absorption length. The third charge collection region is superposed with the first and second charge collection region.

Another aspect of the invention is a method of generating color in an active pixel sensor comprising generating light of a first color in a first charge collection region and generating light of a second color in a second charge collection region. The method further superposes the light of the first color with the light of the second color.

DESCRIPTION OF DRAWINGS

These and other features and advantages of the invention will become more apparent upon reading the following detailed description and upon reference to th accompanying drawings.

DETAILED DESCRIPTION

During video signal processing, numerous data formats are used to represent image information associated with each pixel of a video field so that an original image can be faithfully reproduced. For example, one common color format represents a color using red, green, and blue color components. With this color format, the color of each pixel is represented by quantities of red (R), green (G) and blue (B) color components detected in the original.

Figure 1:
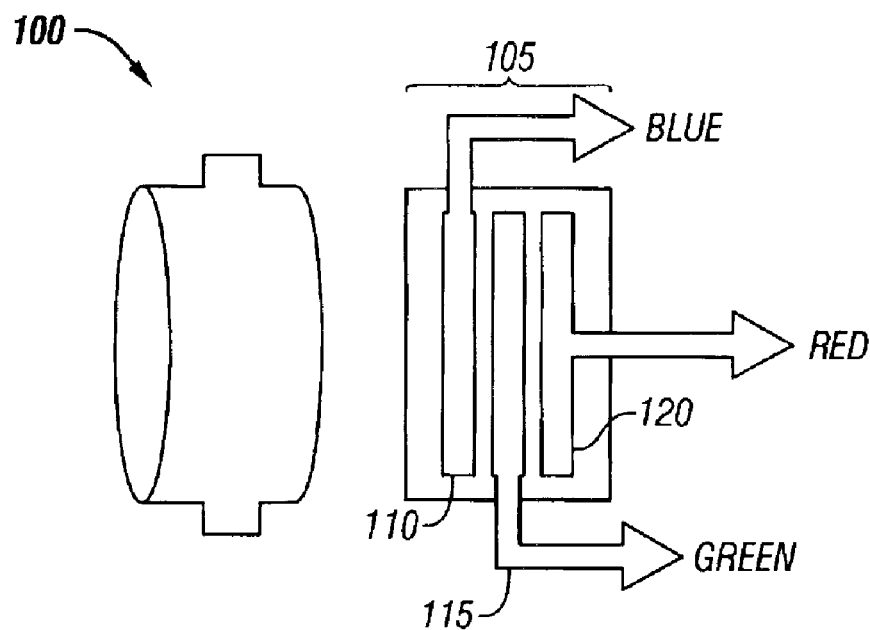
FIG. 1 illustrates a color sensor with three superposed charge collection regions.

FIG. 1 illustrates a color sensor 100 with three superposed charge collection regions 105. The charge collection regions 105 are superposed to provide the color sensor 100 with increased color sensitivity and resolution. The charge collection regions 105 include a first p-n junction 110, a second p-n junction 115, and a third p-n junction 120. Because the absorption length for incident photons in silicon is wavelength dependent, the charge collection regions 105 are highly sensitive to light of different color. The first p-n junction 110 is sensitive to blue light, the second p-n junction 115 is sensitive to green light, and the third p-n junction 120 is sensitive to red light. The spectral response of the charge collection regions 105 is dependent upon the thickness and location of the layers.

The superposed charge collection regions 105 may be used with a pixel having a 4:2:2 sampling mode. The 4:2:2 mode is a ratio of sampling frequencies used to digitize the luminance (Y) and color difference components (R-Y and B-Y). For example, the first color difference component may represent the difference between the red image information and the luminance image information (R-Y) and the second color difference component may represent the difference between the blue image information and the luminance image information (B-Y). The term 4:2:2 denotes that for every four samples of Y, there are 2 samples each of R-Y and B-Y, giving more chrominance bandwidth in relation to luminance compared to standard 4:1:1 sampling.

Figure 2:
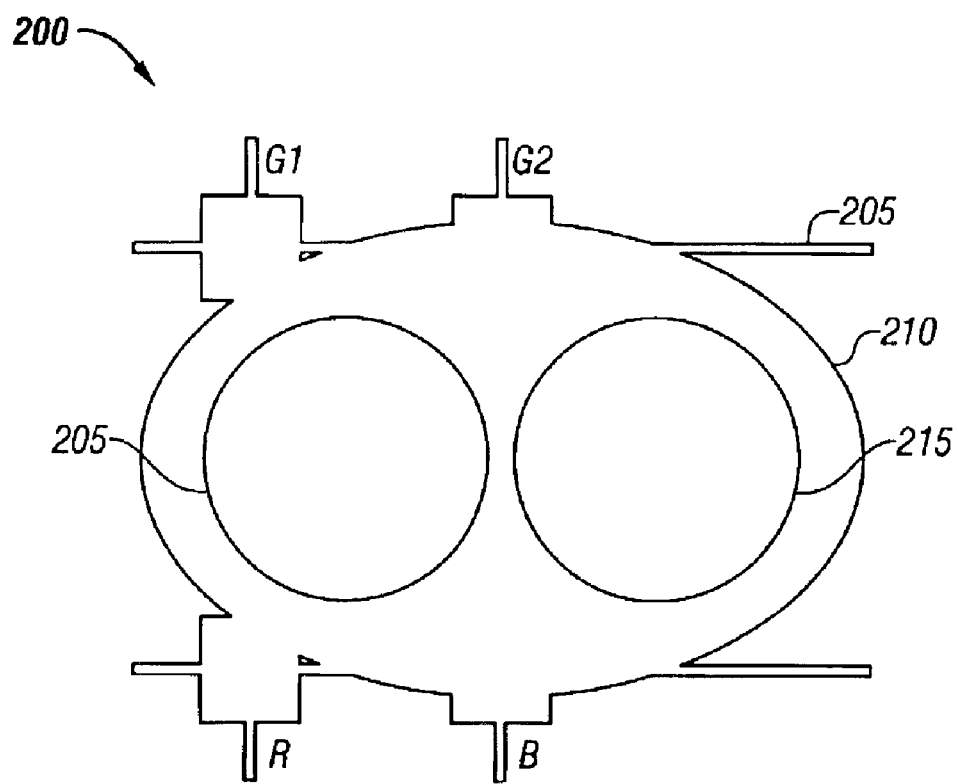
FIG. 2 illustrates a pixel layout according to the present invention using a 4:2:2 sampling standard.

FIG. 2 illustrates a pixel 200 layout according to the present invention using a 4:2:2 sampling mode. Applying color separation in an APS through the use of superposed regions is possible through development of pinned and buried photodiodes, advances in color processing and the continuous scaling down of the CMOS features. The pixel 200 includes a green component 205, a blue component 210, and a red component 215. The combination of the color components 205, 210, 215 provides for increased color sensitivity in the pixel 200.

Figure 3:
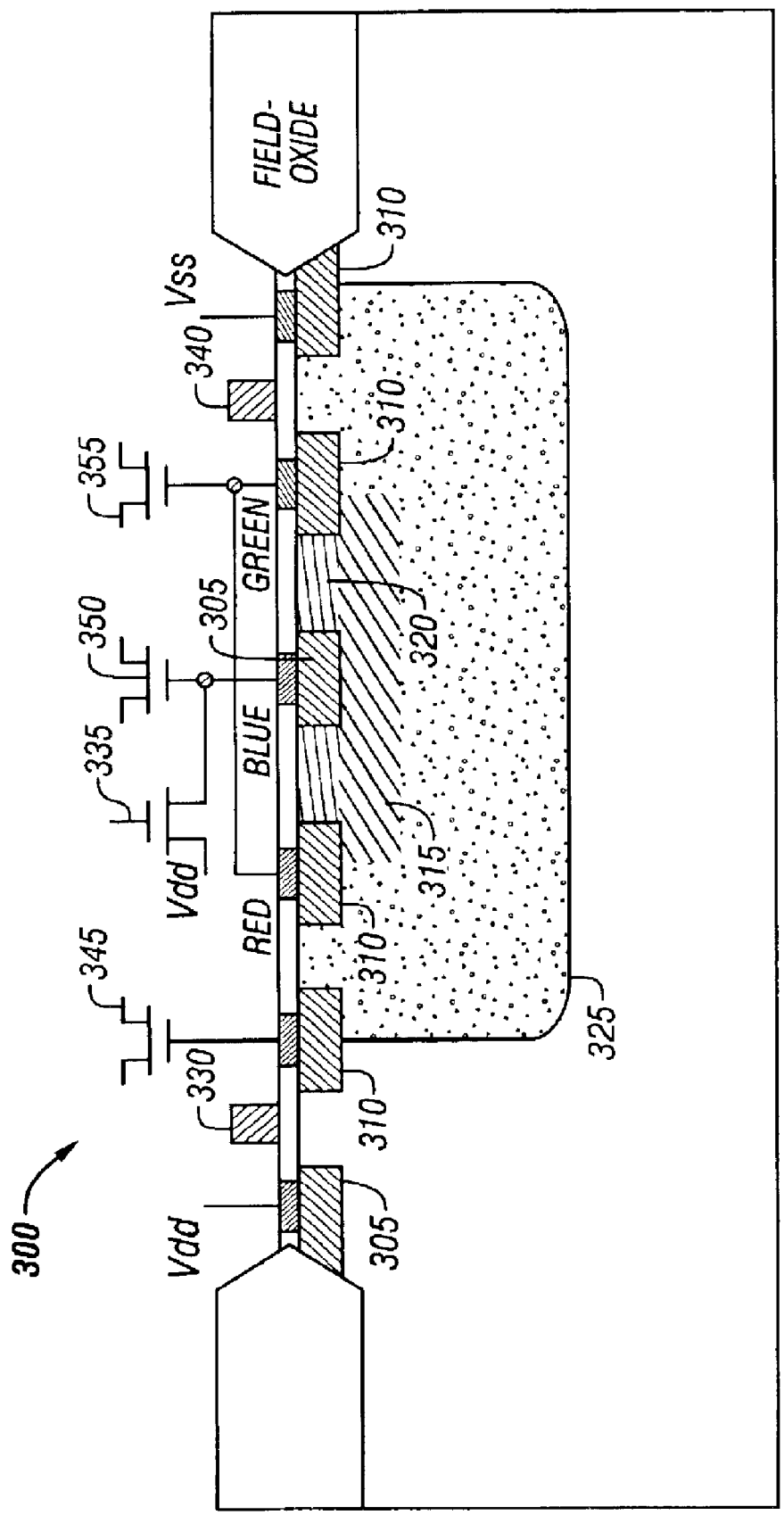
FIG. 3 is a cross-section and schematic diagram for three superposed p-n junction color APS according to the present invention.

FIG. 3 is a cross-section and schematic diagram for three superposed p-n junction color APS 300 according to the present invention. The APS 300 comprises a plurality of N+ floating diffusion regions 305, a plurality of P+ floating diffusion regions 310, a P– buried region 315, a N– surface region 320, a fully depleted N– well 325, NMOS reset transistors 330, 335, a PMOS reset transistor 340, a red output transistor 345, a blue output transistor 350, and a green output transistor 355. Each of the floating diffusion regions 305, 310 is connected to a reset transistor 330, 335, 340 and an output transistor 345 350, 355. The P+ diffusion region 310 is connected to the PMOS reset transistor 340 and the N+ diffusion region 305 is connected to the NMOS reset transistor 330. The fully depleted N– well 325 overlaps the N+ diffusion region 305. The N– well 325 also surrounds the P– buried region 315 and the N– surfaced region 320. The N– suffaced region 320 is proximate the P+ diffusion region 310 and the P– buried region 315. Each of the floating diffusion regions 305, 310 preferably have different integration periods that allow each spectral selection to have flexible saturation exposure.

The color components of the pixel 300 are provided by the output transistors 345, 350, 355. In one embodiment, the output transistor 345 outputs the red component, the output transistor 350 outputs the blue component, and the output transistor 355 outputs the green component. If only two output transistors are desired, the green component may be omitted.

The color APS 300 is capable of performing 4:4:4 sampling mode. In the 4:4:4 sampling mode, there are always an equal number of samples of luminance (Y) and color difference components (R-Y and B-Y). The 4:4:4 sampling mode provides for more data to form the images, and thus the potential of images having a higher resolution and clarity. To perform 4:4:4 sampling, the color APS 300 preferably has at least two separate reset control lines. The number of reset control line is dependent upon the number of implemented superposed layers, with each layer having a separate reset control line.

Numerous variations and modifications of the invention will become readily apparent to those skilled in the art. Accordingly, the invention may be embodied in other specific forms without departing from its spirit or essential characteristics.

What is claimed is:

1. A device comprising:
   a semiconductor substrate, having a first surface which is arranged to receive incoming irradiation;
   at least first and second photoreceptor parts located in said semiconductor substrate, and arranged in said semiconductor substrate in a way such that charges produced by different wavelengths of said incoming radiation are respectively collected by said at least first and second photoreceptor parts; and
   at least first and second separately controlled reset transistors for respectively resetting said at least first and second photoreceptor parts.

2. A device as in claim 1, wherein said first and second photoreceptor parts are at different depths in the semiconductor substrate.

3. A device as in claim 1, wherein said first and second photoreceptor parts are arranged in first and second areas with different semiconductor characteristics.

4. A device as in claim 1, further comprising a third photoreceptor part also arranged in said semiconductor substrate to collect charges produced by different wavelengths of light than the charges collected by said first and second photoreceptor parts.

5. A device as in claim 4, wherein said first, second and third photoreceptor parts each receive light of predominant primary colors.

6. A device as in claim 4, wherein said first, second and third semiconductor parts are superimposed one over another.

7. A device as in claim 4, wherein said first, second and third semiconductor parts are partially overlapping one another.

8. A device as in claim 3, wherein one of said first and second areas comprises a P region, and another of said first and second areas comprises an N region.

9. A device as in claim 4, further comprising a third separately controlled reset transistor for resetting the third photoreceptor part.

10. A device as in claim 1, further comprising first and second output circuits, respectively connected to said first and second photoreceptor parts, and producing output signals based on charges collected by said first and second-photoreceptor parts, respectively.

11. A device as in claim 1, wherein said device is an active pixel sensor capable of operating in 4:4:4 sampling mode.

12. An active pixel sensor comprising:
    a photoreceptor region formed in a substrate and comprising:
        a well region located within said substrate and doped to a first conductivity type;
        a buried region located within said well region and doped to a second conductivity type; and
        a surface region located within said well region near the surface of said substrate and doped to said first conductivity type, said regions collecting charges associated with respective wavelengths of applied light;
    first, second, and third storage regions for respectively receiving and storing said charges associated with said respective wavelengths of applied light; and
    first, second, and third reset transistors for separately controlling the reset of said first, second, and third storage regions.

13. An active pixel sensor as in claim 12, further comprising output circuits for selectively outputting signals from the first, second, and third storage regions representing the amount of charges stored in said storage regions.

14. An active pixel sensor as in claim 13 wherein said output circuits comprise a first, second, and third output transistor associated with said respective first, second, and third storage regions.

15. An active pixel sensor as in claim 13, wherein said active pixel sensor is capable of operating in 4:4:4 sampling mode.

16. An active pixel sensor as in claim 12, wherein said first conductivity type is n-type and said second conductivity type is p-type.

17. An active pixel sensor as in claim 16, wherein at least one of said first, second, and third reset transistors comprises an NMOS transistor, and at least one of said first, second, and third reset transistors comprises a PMOS transistor.

* * * * *

UNITED STATES PATENT AND TRADEMARK OFFICE
CERTIFICATE OF CORRECTION

PATENT NO.    : 6,870,149 B2
DATED         : March 22, 2005
INVENTOR(S)   : Berezin It is certified that error appears in the above-identified patent and that said Letters Patent is hereby corrected as shown below:

Column 2,
Line 8, "th" should read -- the --;

Column 3,
Line 14, "suffaced" should read -- surfaced --;
Line 34, "line" should read -- lines --.

Signed and Sealed this

Twelfth Day of July, 2005

JON W. DUDAS
*Director of the United States Patent and Trademark Office*